(12) United States Patent
Park et al.

(10) Patent No.: US 12,513,830 B2
(45) Date of Patent: Dec. 30, 2025

(54) DISPLAY MODULE AND DISPLAY DEVICE INCLUDING THE SAME

(71) Applicant: LG Display Co., Ltd., Seoul (KR)

(72) Inventors: Chanhyeok Park, Paju-si (KR); Chikyung Sung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 264 days.

(21) Appl. No.: 17/748,894

(22) Filed: May 19, 2022

(65) Prior Publication Data
US 2022/0394860 A1 Dec. 8, 2022

(30) Foreign Application Priority Data

Jun. 8, 2021 (KR) .................. 10-2021-0073924

(51) Int. Cl.
*H05K 5/00* (2025.01)
*B32B 3/26* (2006.01)
*B32B 5/18* (2006.01)
*B32B 7/12* (2006.01)

(52) U.S. Cl.
CPC .......... *H05K 5/0017* (2013.01); *B32B 3/266* (2013.01); *B32B 5/18* (2013.01); *B32B 7/12* (2013.01); *B32B 2266/045* (2013.01); *B32B 2457/20* (2013.01)

(58) Field of Classification Search
CPC .... H05K 5/0017; H05K 5/0018; B32B 3/266; B32B 5/18; B32B 7/12; B32B 2266/045; B32B 2457/20; G09F 9/301; G09F 9/00; G06F 1/1652; G06F 1/1616; G02F 1/133308; G02F 1/133305
See application file for complete search history.

(56) References Cited

U.S. PATENT DOCUMENTS

2016/0357052 A1* 12/2016 Kim .................. G02F 1/133305
2018/0162098 A1*  6/2018 Joo ......................... B32B 9/007
2018/0190936 A1*  7/2018 Lee .......................... B32B 3/30
(Continued)

FOREIGN PATENT DOCUMENTS

CN      112735279 A  *  4/2021  ............ G09F 9/301
KR   10-2018-0121256 A     11/2018
(Continued)

OTHER PUBLICATIONS

Zhang, Yunti; "Curved Surface Display Screen Module", Apr. 30, 2021, Wuhan China Star Optoelectronics Semiconductor Display Tech Co Ltd, Description (Espacenet Machine Translation of CN 112735279 A) (Year: 2021).*
(Continued)

*Primary Examiner* — Jayprakash N Gandhi
*Assistant Examiner* — Jeffrey Francis Stoll
(74) *Attorney, Agent, or Firm* — Fenwick & West LLP

(57) ABSTRACT

A display module and a display device including the same are disclosed. The display module includes a display panel; a metal foam layer having multiple pores formed therein; and an adhesive layer disposed between the display panel and the metal foam layer to adhere the metal foam layer to the display panel, wherein each of the display panel, the adhesive layer and the metal foam layer has at least one bendable area, wherein at least one perforated pattern is formed in the at least one bendable area of the metal foam layer.

8 Claims, 5 Drawing Sheets

(56) References Cited

U.S. PATENT DOCUMENTS

| | | | |
|---|---|---|---|
| 2018/0264776 A1* | 9/2018 | Wang | B32B 27/32 |
| 2019/0067606 A1* | 2/2019 | Han | H10K 59/87 |
| 2019/0204872 A1* | 7/2019 | Lee | G06F 1/1641 |
| 2019/0326530 A1* | 10/2019 | Chen | H10K 59/00 |
| 2019/0334114 A1* | 10/2019 | Park | H05K 5/0226 |
| 2020/0251677 A1 | 8/2020 | Wang et al. | |
| 2020/0319672 A1* | 10/2020 | Kim | H04M 1/0268 |
| 2021/0141124 A1* | 5/2021 | Park | G09F 9/301 |
| 2021/0267073 A1* | 8/2021 | Fan | G06F 1/1656 |
| 2023/0209971 A1* | 6/2023 | Wang | G06F 3/0412 |
| | | | 349/194 |

FOREIGN PATENT DOCUMENTS

| | | |
|---|---|---|
| KR | 10-2020-0049443 A | 5/2020 |
| TW | 202042006 A | 11/2020 |
| TW | 202104490 A | 2/2021 |
| WO | WO 2020/162864 A1 | 8/2020 |

OTHER PUBLICATIONS

Taiwan Intellectual Property Office, Office Action, TW Patent Application No. 111119003, Dec. 27, 2022, six pages.

* cited by examiner

DISPLAY MODULE AND DISPLAY DEVICE INCLUDING THE SAME

CROSS-REFERENCE TO RELATED APPLICATION

This application claims priority under 35 U.S.C. 119(a) from Republic of Korea Patent Application No. 10-2021-0073924 filed on Jun. 8, 2021, which is incorporated by reference herein.

BACKGROUND

Field

The present disclosure relates to a display module and a display device including the same, and more particularly, to a display module capable of reducing concentration of stress due to bending thereof and a display device including the same.

Description of Related Art

A display device that implements various information on a screen is a key technology in information and communication era, and is developing so as to have higher performance while being thinner, lighter, and more portable.

Recently, as display technology develops, a foldable display device is being developed. Such a foldable display device may be applied to various electronic devices.

The foldable display device may have increase in a thickness thereof by two times compared to an unfolded state due to characteristics thereof. Therefore, in order to reduce an overall thickness of the display device in the folded state, it is necessary to minimize a thickness of each of various parts, and furthermore, it is important how much the display device may be folded.

SUMMARY

A foldable display device requires a sophisticated design regarding a folding amount because damages such as cracks may occur due to characteristics of organic and inorganic films formed in a thin-film process when the device has been folded in a folded amount corresponding to a value smaller than a certain radius of curvature.

Further, the foldable display device may be damaged when stress due to bending thereof is concentrated on a bent area.

Accordingly, the applicants of the present disclosure have invented a display module and a display device that may reduce the concentration of stress caused by the bending.

A purpose of the present disclosure is to provide a display module capable of reducing the concentration of stress due to the bending on a bendable area and a display device including the same.

Further, another purpose of the present disclosure is to provide a display module capable of improving rigidity and heat dissipation performance and a display device including the same.

Further, still another purpose of the present disclosure is to provide a display module that may reduce a cost of each of parts and a display device including the same.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

A display module according to one embodiment includes a display panel and a metal foam layer, and at least one perforated pattern is formed in a portion of the metal foam layer corresponding to a bendable area.

A display module according to one embodiment includes a display panel and a metal foam layer, wherein an organic material layer is included in a bendable area so that the bendable area has a lower modulus than that of a non-bendable area.

A display module according to one embodiment includes a display panel; a metal foam layer having multiple pores formed therein; and an adhesive layer disposed between the display panel and the metal foam layer to adhere the metal foam layer to the display panel, wherein each of the display panel, the adhesive layer and the metal foam layer has at least one bendable area, wherein at least one perforated pattern is formed in the at least one bendable area of the metal foam layer.

A display device according to one embodiment includes a display module, wherein the display module includes: a display panel; a metal foam layer having multiple pores formed therein; and an adhesive layer disposed between the display panel and the metal foam layer to adhere the metal foam layer to the display panel, wherein each of the display panel, the adhesive layer and the metal foam layer has at least one bendable area, wherein at least one perforated pattern is formed in the at least one bendable area of the metal foam layer.

A display module according to one embodiment includes a display panel; a metal foam layer having multiple pores formed therein; and an adhesive layer disposed between the display panel and the metal foam layer to adhere the metal foam layer to the display panel, wherein each of the display panel, the adhesive layer and the metal foam layer has a bendable area and a non-bendable area, wherein the bendable area includes an organic material layer so that the bendable area has a lower modulus than a modulus of the non-bendable area.

A display device according to one embodiment includes a display module, wherein the display module includes: a display panel; a metal foam layer having multiple pores formed therein; an adhesive layer disposed between the display panel and the metal foam layer to adhere the metal foam layer to the display panel, wherein each of the display panel, the adhesive layer and the metal foam layer has a bendable area and a non-bendable area, wherein the bendable area includes an organic material layer so that the bendable area has a lower modulus than a modulus of the non-bendable area.

In the display module according to the embodiment and the display device including the same, the at least one perforated pattern is formed in a portion of the metal foam layer corresponding to the bendable area, thereby reducing the concentration of stress due to bending on the bendable area.

Further, in the display module according to the embodiment and the display device including the same, the organic material layer is included in the bendable area so that the bendable area has a low modulus, thereby reducing the concentration of stress according to bending in the bendable area.

Further, the display module according to the embodiment and the display device including the same may have improved rigidity and heat dissipation performance because the metal foam layer having the multiple pores is disposed on the lower portion of the display panel.

Further, in the display module according to the embodiment and the display device including the same, the metal foam layer is applied to the lower portion of the display panel and the perforated pattern is formed in the bendable area of the metal foam layer, so that a cost of a part thereof may be reduced due to the perforation.

Effects of the present disclosure are not limited to the above-mentioned effects, and other effects as not mentioned will be clearly understood by those skilled in the art from following descriptions.

DETAILED DESCRIPTIONS

Figure 1:
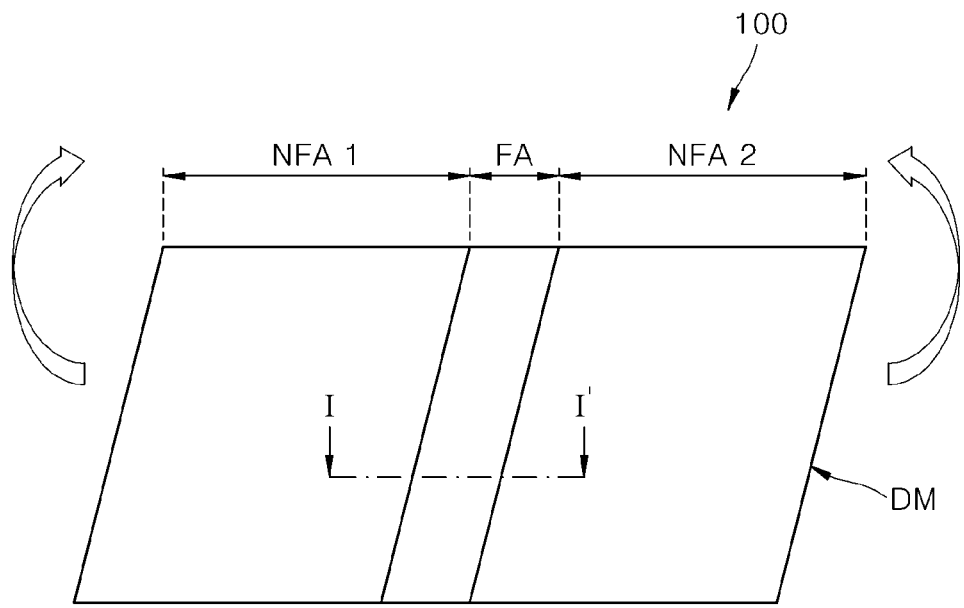
FIG. 1 is a diagram of a display module according to one embodiment and a display device including the same.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one or when preceding a list of" elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

As used herein, the term "substantially," "about," and similar terms are used as terms of approximation, and are intended to account for inherent deviations in measured or calculated values that would be recognized by those of ordinary skill in the art. The term may be used to prevent unauthorized exploitation by an unauthorized infringer to design around accurate or absolute figures provided to help understand the present disclosure.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display module capable of reducing concentration of stress due to bending on a bendable area and a display device including the same are disclosed.

FIG. 1 is a diagram of a display module DM according to one embodiment and a display device 100 including the same.

Referring to FIG. 1, a display device 100 may include a foldable display module DM.

The display module DM may be divided into a plurality of areas based on whether the areas are bendable or not. In one example, the display module DM may be divided into a first non-bendable area NFA1, a second non-bendable area NFA2, and a bendable area FA. The bendable area FA may be located between the first non-bendable area NFA1 and the second non-bendable area NFA2.

The bendable area FA may refer to an area at which the display module is bent, and may be defined as an area in which stress due to the bending occurs. In this embodiment, one bendable area FA is exemplified in the display module DM. However, the present disclosure is not limited thereto. The display module DM may include a plurality of bendable areas.

The display module DM may have an in-folded state or an out-folded state. The in-folded state may be defined as a state in which the display module is folded such that display faces of the display module DM from which images are to be displayed face each other. The out-folded state may be defined as a state in which the display module is folded such that back faces of the display module DM face each other.

The display device 100 may further include a source driver (not shown) that converts image data into a source signal and provides the source signal to the display module DM, and a timing controller (not shown) that provides the image data received from a host system to the source driver.

Figure 2:
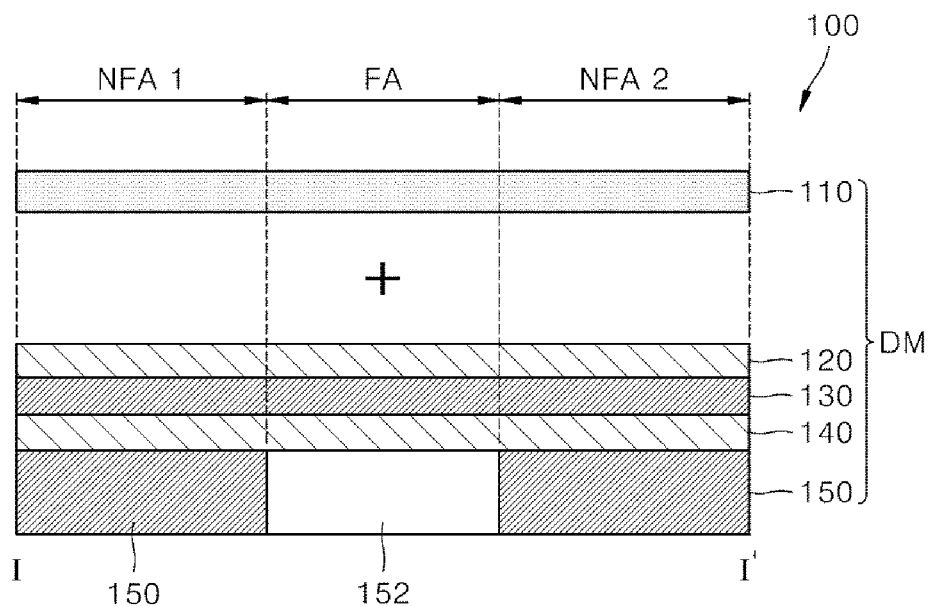
FIG. 2 is a cross-sectional view along a cutting line I-I' shown in FIG. 1, and is a partial cross-sectional view of a display module according to a first embodiment.

FIG. 2 is a cross-sectional view along a cutting line I-I' shown in FIG. 1, and is a partial cross-sectional view of the display module DM according to a first embodiment.

Each of front portion and upper portion directions defined in the present disclosure means a Z-axis direction, and each of back portion and lower portion directions means a −Z-axis direction. Although the Z-axis is not shown in the drawings, the Z-axis direction is, for example, the upward direction in the diagram of FIG. 2, and the −Z-axis direction is, for example, the downward direction in the diagram of FIG. 2.

Referring to FIG. 2, the display module DM according to the first embodiment includes a display panel 110, a first adhesive layer 120, a first support plate 130, a second adhesive layer 140, and a second support plate 150.

The display panel 110 includes a display area for displaying an image in a frontward direction. In one example, a plurality of sub-pixels (not shown), a plurality of data lines (not shown), and a plurality of gate lines (not shown) may be arranged in the display area.

The first support plate 130 is disposed on a lower portion of the display panel 110. The first adhesive layer 120 is disposed between the display panel 110 and the first support plate 130 to adhere the first support plate 130 to the lower portion of the display panel 110.

The first support plate 130 may be formed as a thin-film having a thickness smaller than a thickness of the first adhesive layer 120. In one example, the first support plate 130 may be composed of a stainless steel thin-film.

The second support plate 150 is disposed under the first support plate 130. The second adhesive layer 140 is disposed between the first support plate 130 and the second support plate 150 to adhere the second support plate 150 to a lower portion of the first support plate 130.

The second support plate 150 may be formed to have a greater thickness than that of the first support plate 130. In one example, the second support plate 150 may have a thickness greater than that of the first support plate 130 and be made of stainless steel as the same material as that of the first support plate 130.

The second support plate 150 may be divided into a first non-bendable area NFA1, a second non-bendable area NFA2, and a bendable area FA based on whether the areas are bendable or not when the display module DM is folded.

A perforation 152 may be formed in the bendable area FA of the second support plate 150. In one example, in the second support plate 150, the perforation 152 having a width and a thickness corresponding to a width and a thickness, respectively, of the bendable area FA may be formed in the bendable area FA.

The display module DM includes the perforation 152 formed in the bendable area FA of the second support plate 150 to reduce the stress due to the bending.

Figure 3:
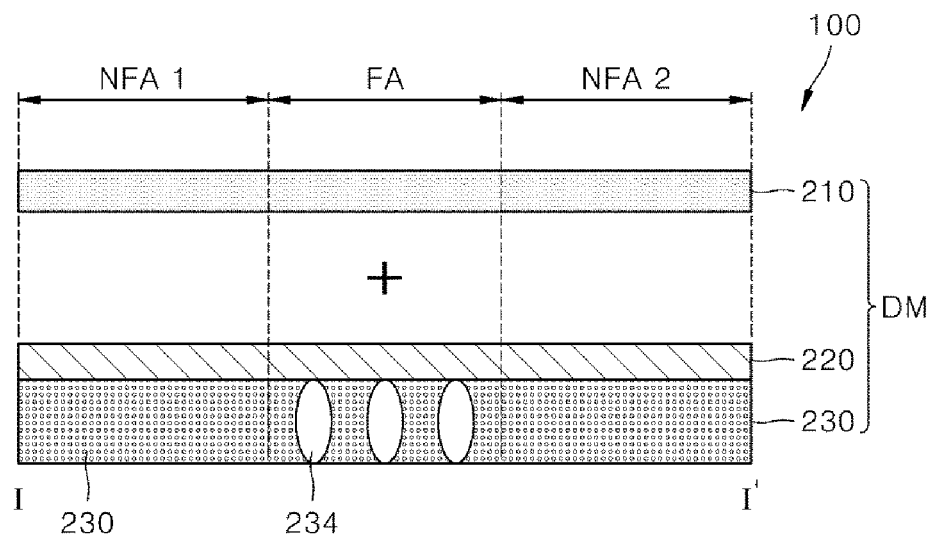
FIGS. 3 to 6 are cross-sectional views along the cutting line I-I' shown in FIG. 1, and are partial cross-sectional views of display modules according to a second embodiment to a fifth embodiment, respectively.

FIG. 3 is a cross-sectional view along the cutting line I-I' shown in FIG. 1, and is a partial cross-sectional view of the display module DM according to a second embodiment.

Referring to FIG. 3, the display module DM according to the second embodiment includes a display panel 210, an adhesive layer 220, and a metal foam layer 230.

The display panel 210 includes a display area for displaying an image in a frontward direction.

A metal foam layer 230 is disposed on a lower portion of the display panel 210. The adhesive layer 220 is disposed between the display panel 210 and the metal foam layer 230 to adhere the metal foam layer 230 to the lower portion of the display panel 210.

The metal foam layer 230 includes a metal as a main component thereof and has multiple pores therein. In one example, the metal foam layer 230 may include copper as a main component, and multiple pores formed therein. The metal foam layer 230 may have elasticity or shock absorption due to the plurality of pores.

In the present disclosure, description of a process of manufacturing the metal foam layer 230 mainly composed of the metal and having a large number of pores therein is omitted because it is determined that the description may obscure a main point of the present disclosure.

The metal foam layer 230 may include the first non-bendable area NFA1, the second non-bendable area NFA2 and the bendable area FA. At least one perforated pattern 234 is formed in the bendable area FA of the metal foam layer 230. The perforated pattern 234 extends in a thickness direction of the metal foam layer 230.

The perforated pattern 234 may be formed in a shape having a width that gradually decreases as it extends from a vertical center toward each of a top and a bottom.

In one example, the perforated pattern 234 may be formed in an oval shape extending in the thickness direction of the metal foam layer 230. In another example, the perforated pattern 234 may be formed into a rhombus extending in the thickness direction of the metal foam layer 230. In still another example, the perforated pattern 234 may be deformed into a shape such that the stress caused by the folding of the display module DM may be reduced in the bendable area FA as the pattern is perforated in the thickness direction thereof.

Moreover, FIG. 3 exemplifies three perforated patterns 234. However, the disclosure is not limited thereto. The number and size of the perforated patterns 234 may be determined according to a size of the bendable area or magnitude of stress according to the bending.

In the display module DM according to the second embodiment, at least one perforated pattern 234 is formed in a portion of the metal foam layer 230 corresponding to the bendable area FA and extends in the thickness direction of the metal foam layer 230. Thus, the concentration of the stress due to the bending on the bendable area FA may be reduced.

Further, in the display module DM according to the second embodiment, the metal foam layer 230 having multiple pores formed therein is disposed on the lower portion of the display panel 210, such that the rigidity and heat dissipation performance of the display device may be improved.

Further, in the display module DM according to the second embodiment, the metal foam layer 230 made of a copper material is applied to the lower portion of the display panel 210 and the perforated pattern 234 is formed in the bendable area FA of the metal foam layer 230. Thus, a cost of a part of the device may be lowered due to the perforated pattern.

Figure 4:
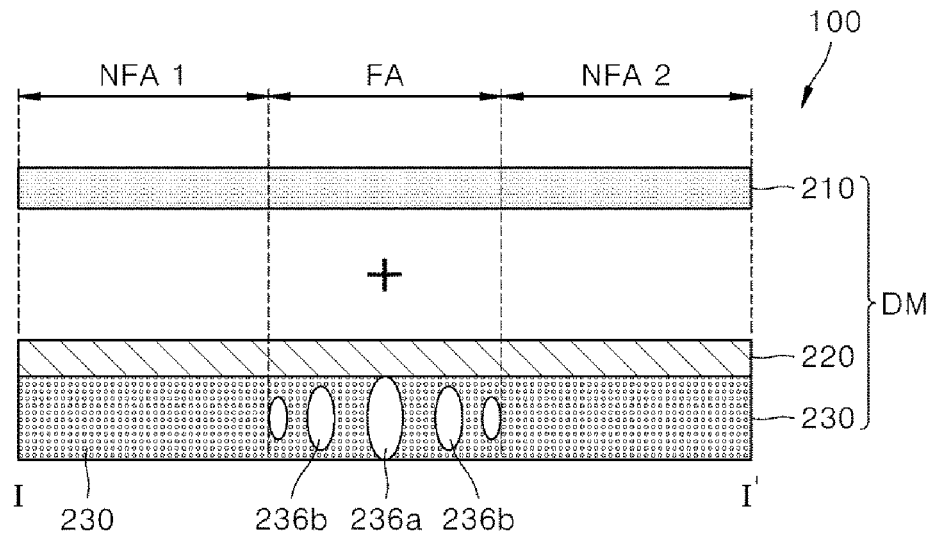

FIG. 4 is a cross-sectional view along the cutting line I-I' shown in FIG. 1, and is a partial cross-sectional view of the display module DM according to a third embodiment.

Referring to FIG. 4, the display module DM according to the third embodiment includes the display panel 210, the adhesive layer 220, and the metal foam layer 230. In this regard, the description of the same components as those in FIG. 3, that is, the display panel 210 and the adhesive layer 220, is replaced with the description thereof in FIG. 3.

The metal foam layer 230 is disposed on the lower portion of the display panel 210, and includes copper as a main component, and has multiple pores formed therein.

The metal foam layer 230 includes the first non-bendable area NFA1, the second non-bendable area NFA2 and the bendable area FA. A first perforated pattern 236a and second perforated patterns 236b are formed in the bendable area FA.

The first perforated pattern 236a and the second perforated patterns 236b formed in the bendable area FA of the metal foam layer 230 may extend in the thickness direction of the metal foam layer 230.

In one example, the first perforated pattern 236a in a horizontal center of the bendable area FA of the metal foam layer 230 may extend in the thickness direction of the metal foam layer 230. The second perforated patterns 236b having a thickness smaller than that of the first perforated pattern 236a and formed around the first perforated pattern 236a may extend in the thickness direction of the metal foam layer 230.

In another example, the first perforated pattern 236a in a horizontal center of the bendable area FA of the metal foam layer 230 may extend in the thickness direction of the metal foam layer 230. The second perforated patterns formed around the first perforated pattern 236a may extend in a width direction of the metal foam layer 230.

In still another example, the first perforated pattern 236a in a horizontal center of the bendable area FA of the metal foam layer 230 may extend in the width direction of the metal foam layer 230. The second perforated patterns may be formed above and below the first perforated pattern 236a and may extend in the thickness direction of the metal foam layer 230.

In the display module DM according to the third embodiment, the first perforated pattern 236a and the second perforated patterns 236b may be formed in a portion of the metal foam layer 230 corresponding to the bendable area FA. Thus, concentration of the stress due to bending of the display module DM on the bendable area FA may be reduced.

Further, in the display module DM according to the third embodiment, the metal foam layer 230 having the multiple pores is disposed on the lower portion of the display panel 210, such that the rigidity and heat dissipation performance of the display device may be improved.

Further, in the display module DM according to the third embodiment, the metal foam layer 230 made of a copper material may be applied to the lower portion of the display panel 210, and the first perforated pattern 236a and the second perforated patterns 236b may be formed in the bendable area FA of the metal foam layer 230. Thus, a cost of a part of the module may be reduced due to the perforation.

Figure 5:
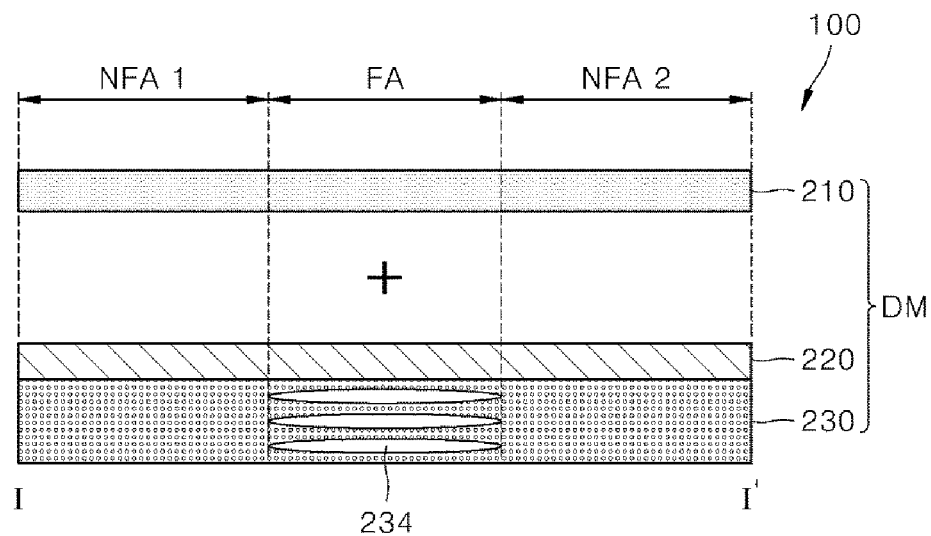

FIG. 5 is a cross-sectional view along the cutting line I-I' shown in FIG. 1, and is a partial cross-sectional view of the display module DM according to a fourth embodiment.

Referring to FIG. 5, the display module DM according to the fourth embodiment includes the display panel 210, the adhesive layer 220, and the metal foam layer 230.

The metal foam layer 230 is disposed on the lower portion of the display panel 210, and includes copper as a main component, and has multiple pores formed therein.

The metal foam layer 230 includes the first non-bendable area NFA1, the second non-bendable area NFA2, and the bendable area FA. At least one perforated pattern 234 is formed in the bendable area FA.

In one example, the at least one perforated pattern 234 may be formed in the bendable area FA of the metal foam layer 230 and may extend in a width direction of the metal foam layer 230.

At least one perforated pattern 234 may be formed in a shape having a thickness that gradually decreases as it extends from a horizontal center toward each of both opposing sides. In one example, the perforated pattern 234 may be formed in an oval shape extending in the width direction of the metal foam layer 230. In another example, the perforated pattern 234 may be formed in a rhombus shape extending in the width direction of the metal foam layer 230.

In another example, the shape of the perforated pattern 234 may be deformed into a shape such that the stress caused by bending of the display module DM may be reduced in the bendable area FA when the pattern is perforated in the width direction. Moreover, the size and number of the perforated patterns 234 may be determined according to the size of the bendable area FA or the magnitude of the stress.

Moreover, FIG. 5 exemplifies three perforated patterns 234. The disclosure is not limited thereto. The number and size of the perforated patterns 234 may be determined according to the size of the bendable area or a magnitude of stress according to bending.

In the display module DM according to the fourth embodiment, at least one perforated pattern 234 is formed in a portion of the metal foam layer 230 corresponding to the bendable area FA and extend in the width direction of the metal foam layer 230, so that concentration of the stress due to bending on the bendable area FA may be reduced.

Further, in the display module DM according to the fourth embodiment, the metal foam layer 230 having multiple pores is disposed on the lower portion of the display panel 210, such that the rigidity and heat dissipation performance of the device may be improved.

Further, in the display module DM according to the fourth embodiment, the metal foam layer 230 including a copper material is applied to the lower portion of the display panel 210 and the at least one perforated pattern 234 is formed in the bendable area FA of the metal foam layer 230. Thus, a cost of a part of the device may be reduced due to the perforation.

Figure 6:
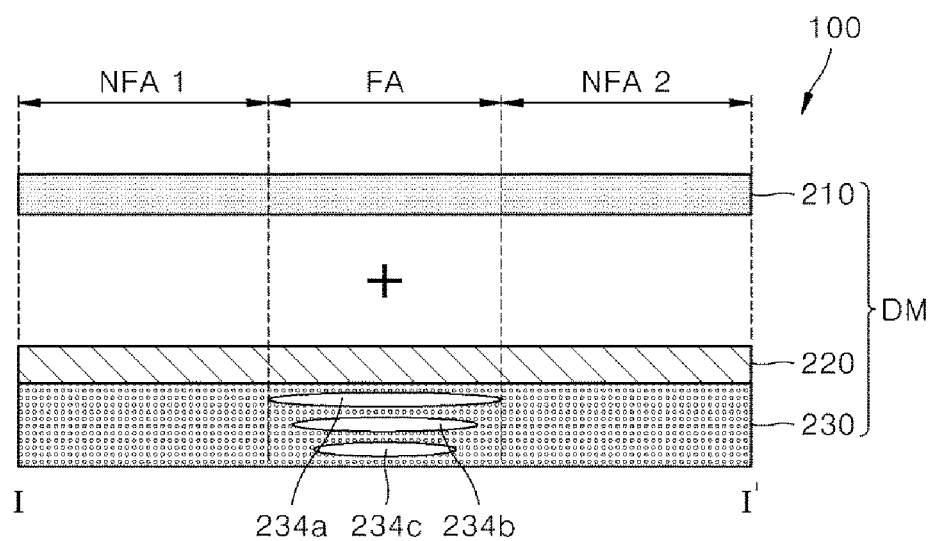

FIG. 6 is a cross-sectional view along the cutting line I-I' shown in FIG. 1, and is a partial cross-sectional view of the display module DM according to a fifth embodiment.

Referring to FIG. 6, the display module DM according to the fifth embodiment includes the display panel 210, the adhesive layer 220, and the metal foam layer 230.

The metal foam layer 230 is disposed on the lower portion of the display panel 210, and includes the first non-bendable area NFA1, the second non-bendable area NFA2 and bendable area FA. A third perforated pattern 234*a* and fourth perforated patterns 234*b* and 234*c* are formed in the bendable area FA and extend in the width direction of the metal foam layer 230.

In one example, the third perforated pattern 234*a* may be formed at an upper portion of the bendable area FA of the metal foam layer 230 and may extend in the width direction of the metal foam layer 230. The fourth perforated patterns 234*b* and 234*c* having a smaller width than that of the third perforated pattern 234*a* may be disposed under the third perforated pattern 234*a* and may extend in the thickness direction of the metal foam layer 230.

In another example, the third perforated pattern 234*a* may be formed in a vertical center of the bendable area FA of the metal foam layer 230 and may extend in the width direction of the metal foam layer 230. The fourth perforated patterns 234*b* and 234*c* may be formed above and below the third perforated pattern 234*a* and may extend in the width direction of the metal foam layer 230.

In still another example, the third perforated pattern 234*a* may be formed at a lower portion of the bendable area FA of the metal foam layer 230 and may extend in the width direction of the metal foam layer 230. The fourth perforated patterns 234*b* and 234*c* having a smaller width than that of the third perforated pattern 234*a* may be formed above the third perforated pattern 234*a* and may extend in the width direction of the metal foam layer 230.

In the display module DM according to the fifth embodiment, the third perforated pattern 234*a* and the fourth perforated patterns 234*b* and 234*c* are formed in a portion of the metal foam layer 230 corresponding to the bendable area FA, so that the concentration of the stress caused by the bending of the display module DM on the bendable area FA may be reduced.

Further, in the display module DM according to the fifth embodiment, the metal foam layer 230 having the multiple pores is disposed on the lower portion of the display panel 210, such that the rigidity and heat dissipation performance of the device may be improved.

Further, in the display module DM according to the fifth embodiment, the metal foam layer 230 made of the copper material is applied to the lower portion of the display panel 210, and the third perforated pattern 234*b* and the fourth perforated patterns 234*c* are formed in the bendable area FA of the metal foam layer 230, so that a cost of a part of the device may be reduced due to perforation.

In one example, the display device 100 may be constructed such that at least one of the extension direction, the thickness, the width and the shape of at least one perforated pattern formed in a portion of the metal foam layer 230 corresponding to the bendable area FA of the display module DM may be determined based on whether the device is in the in-folded state or the out-folded state.

Figure 7:
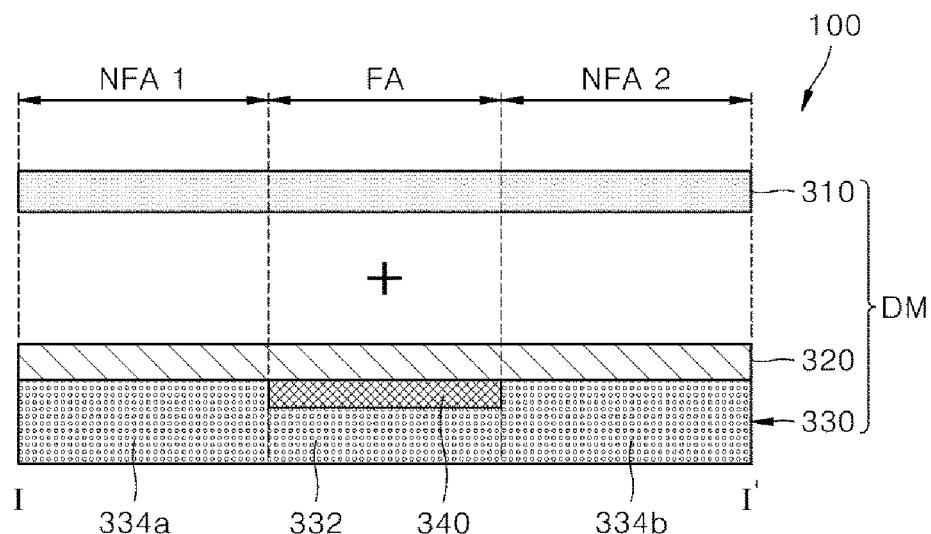
FIGS. 7 to 9 are cross-sectional views along the cutting line I-I' shown in FIG. 1, and are partial cross-sectional views of display modules according to sixth to eighth embodiments, respectively.

FIG. 7 is a cross-sectional view along the cutting line I-I' shown in FIG. 1, and is a partial cross-sectional view of the display module DM according to a sixth embodiment.

Referring to FIG. 7, the display module DM according to the sixth embodiment includes a display panel 310, an adhesive layer 320, and a metal foam layer 330.

The display panel 310 includes a display area for displaying an image in the frontward direction.

The metal foam layer 330 is disposed on the lower portion of the display panel 310. The metal foam layer 330 is fixed to the lower portion of the display panel 310 via the adhesive layer 320. The adhesive layer 320 is disposed between the display panel 310 and the metal foam layer 330 to adhere the metal foam layer 330 to the display panel 310.

The metal foam layer 330 may include copper as a main component, and a plurality of pores may be formed inside the metal foam layer 330. The metal foam layer 330 may have elasticity or shock absorption due to the plurality of pores.

The metal foam layer 330 includes the first non-bendable area NFA1, the second non-bendable area NFA2 and bendable area FA. An organic material layer 340 is included in the bendable area FA so that the bendable area FA has a lower modulus than that of each of the first non-bendable area NFA1 and the second non-bendable area NFA2.

The metal foam layer 330 includes a first metal foam layer 332 corresponding to the bendable area FA, a second metal foam layer 334*a* corresponding to the first non-bendable area NFA1, and a third metal foam layer 334*b* corresponding to the second non-bendable area NFA2.

The first metal foam layer 332 is disposed between the second metal foam layer 334*a* and the third metal foam layer 334*b*, and a thickness of the first metal foam layer 332 is smaller than that of each of the second metal foam layer 334*a* and the third metal foam layer 334*b*.

The organic material layer 340 may be received in a space corresponding to a difference between thicknesses or vertical dimensions of the first metal foam layer 332 and each of the second metal foam layer 334*a* and the third metal foam layer 334*b*.

In one example, the organic material layer 340 may be disposed between the adhesive layer 320 and the first metal foam layer 332 and in the bendable area FA of the display module DM.

In one example, a thickness of the organic material layer 340 may be smaller than that of the first metal foam layer 332. In another example, the thickness of the organic material layer 340 may be smaller than the thickness of the first metal foam layer 332. The thickness of the organic material layer 340 may be determined based on an amount of stress caused by the bending or target values of the rigidity and heat dissipation performance of the display module DM.

The display module DM according to the sixth embodiment includes the organic material layer 340 in the bendable area FA so that the bendable area FA has a low modulus, thereby reducing the concentration of stress due to bending on the bendable area FA.

Further, in the display module DM according to the sixth embodiment, the metal foam layer 330 having the plurality of pores is disposed on the lower portion of the display panel 310, such that rigidity and heat dissipation performance of the device may be improved.

Further, in the display module DM according to the sixth embodiment, the organic material layer 340 is formed in the bendable area FA and between the adhesive layer 320 and the first metal foam layer 332, such that a cost of a part of the device may be reduced due to the perforation.

Figure 8:
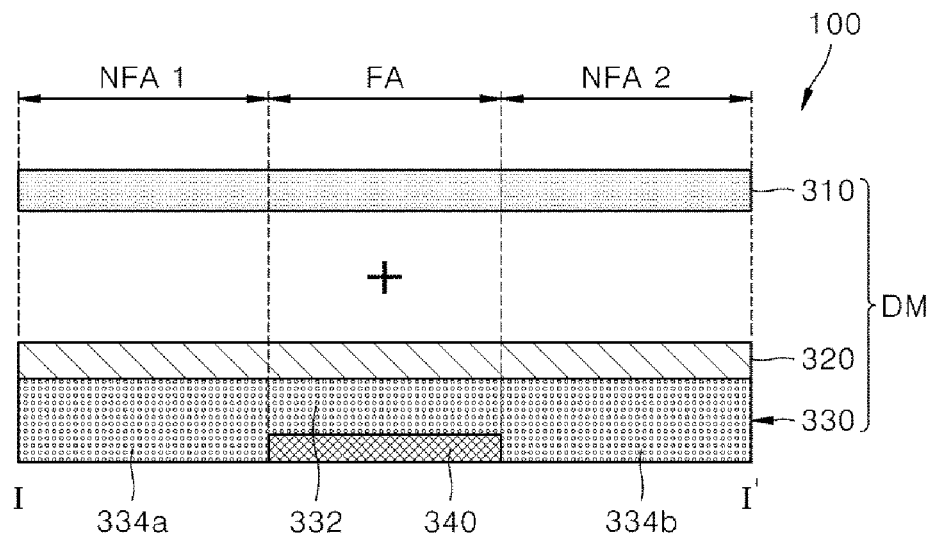

FIG. 8 is a cross-sectional view along the cutting line I-I' shown in FIG. 1, and is a partial cross-sectional view of the display module DM according to a seventh embodiment.

Referring to FIG. 8, the display module DM according to the seventh embodiment includes the display panel 310, the adhesive layer 320, and the metal foam layer 330. The description of the display panel 310 and the adhesive layer 320 as the same components as those of FIG. 7 is replaced with the description thereof in FIG. 7.

The display module DM includes the organic material layer 340 in the bendable area FA so that a modulus of the bendable area FA is lower than that of each of the first non-bendable area NFA1, and the second non-bendable area NFA2.

The first metal foam layer 332 corresponding to the bendable area FA is formed to have a smaller thickness than that of each of the second metal foam layer 334a and the third metal foam layer 334b corresponding to the first non-bendable area NFA1 and the second non-bendable area NFA2, respectively.

The organic material layer 340 may be received in a space disposed below the first metal foam layer 332 and corresponding to a difference between the thicknesses of the first metal foam layer 332 and each of the second metal foam layer 334a and the third metal foam layer 334b.

In one example, the organic material layer 340 may be disposed under the first metal foam layer 332 and in the bendable area FA of the display module DM. In another example, the organic material layer 340 may be formed to have a smaller thickness than that of the first metal foam layer 332. In this regard, the thickness of the organic material layer 340 may be determined based on the amount of stress caused by bending or target values of rigidity and heat dissipation performance of the display module DM.

The display module DM according to the seventh embodiment includes the organic material layer 340 in the bendable area FA so that the bendable area FA has a low modulus, thereby reducing the concentration of stress due to bending on the bendable area FA.

Further, in the display module DM according to the seventh embodiment, the metal foam layer 330 having the plurality of pores is disposed on the lower portion of the display panel 310, such that the rigidity and heat dissipation performance of the device may be improved.

Further, in the display module DM according to the seventh embodiment, the organic material layer 340 is formed under the first metal foam layer 332 and in the bendable area FA, such that a cost of a part of the device is reduced due to the perforation.

Figure 9:
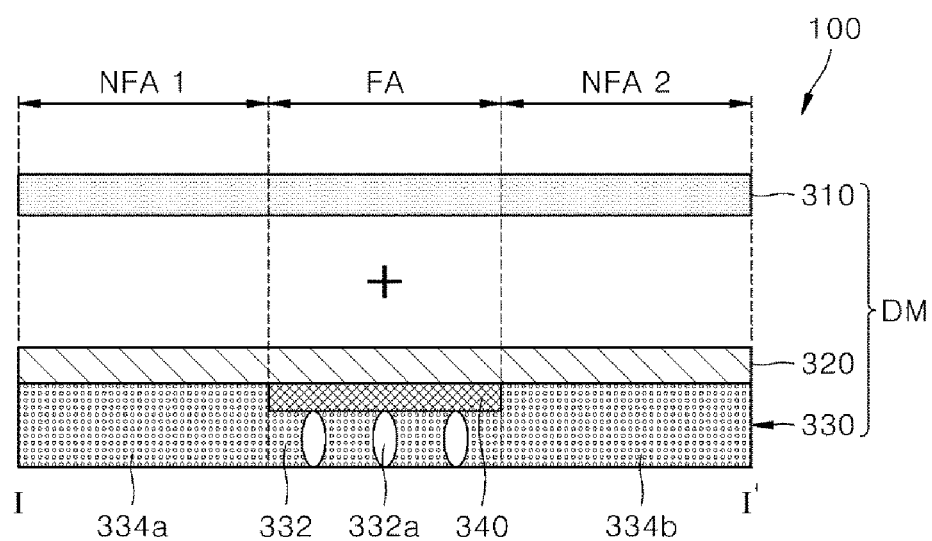

FIG. 9 is a cross-sectional view along the cutting line I-I' shown in FIG. 1, and is a partial cross-sectional view of the display module DM according to an eighth embodiment.

Referring to FIG. 9, the display module DM according to the eighth embodiment includes the display panel 310, the adhesive layer 320, and the metal foam layer 330. In this regard, the description of the display panel 310 and the adhesive layer 320 as the same components as those in FIG. 7 is replaced with the description thereof in FIG. 7.

The display module DM includes the organic material layer 340 in the bendable area FA. The bendable area FA includes the organic material layer 340 and thus has a lower modulus than that of each of the first non-bendable area NFA1 and the second non-bendable area NFA2. The bendable area FA includes the organic material layer 340 and the first metal foam layer 332 containing therein a large number of pores. Thus, the module has elasticity to reduce the stress due to bending.

In one example, the first metal foam layer 332 is formed to have a smaller thickness than that of each of the second metal foam layer 334a and the third metal foam layer 334b. The organic material layer 340 may be received in a space corresponding to the thickness difference.

In one example, the organic material layer 340 may be disposed between the first metal foam layer 332 and the adhesive layer 320, and may have a thickness smaller than that of the first metal foam layer 332. The thickness of the organic material layer 340 may be determined based on the amount of stress caused by bending or the target values of the rigidity and heat dissipation performance of the display module DM.

In another example, at least one perforated pattern 332a may be additionally formed in the first metal foam layer 332 disposed under the organic material layer 340. In one example, the perforated pattern 332a may extend in the thickness direction of the first metal foam layer 332. In another example, the perforated pattern 332a may extend in the width direction of the first metal foam layer 332.

The display module DM according to the eighth embodiment includes, in the bendable area FA, the organic material layer 340 and the first metal foam layer 332 in which the plurality of pores are formed. Further, the at least one perforated pattern 332a is formed in the first metal foam layer 332, thereby reducing the concentration of stress due to bending on the bendable area FA.

Further, in the display module DM according to the eighth embodiment, the metal foam layer 330 having the plurality of pores is disposed on the lower portion of the display panel 310, such that the rigidity and heat dissipation performance of the device may be improved.

Further, in the display module DM according to the eighth embodiment, the organic material layer 340 is disposed between the adhesive layer 320 and the first metal foam layer 332 in the bendable area FA, and the at least one perforated pattern 332a is formed in the first metal foam layer 332. Thus, a cost of a part of the device may be reduced due to the perforation.

In one example, the thickness and the position of the organic material layer 340 included in the bendable area FA of the display module DM may be determined based on whether the display device 100 is in the in-folded state or the out-folded state. Moreover, the extension direction, the thickness, the width and the shape of the perforated pattern formed in the first metal foam layer 332 corresponding to the bendable area FA may be determined based on whether the display device 100 is in the in-folded state or the out-folded state.

The display module DM according to the first embodiment includes the display panel 110, the first adhesive layer 120, the first support plate 130, the second adhesive layer 140, and the second support plate 150. The first support plate 130 is disposed under the display panel 110 and comprised of a stainless steel thin-film. The second support plate 150 is disposed under the second support plate 150 and has a greater thickness than that of the first support plate 130. The perforation corresponding to the width of the bendable area FA is formed in a portion of the second support plate 150 corresponding to the bendable area FA.

The display module DM according to the second embodiment includes the display panel 210, the adhesive layer 220 bonded to the lower portion of the display panel 210, and the metal foam layer 230 bonded to the lower portion of the adhesive layer 220 and having a plurality of pores therein. Each of the display panel 210, the adhesive layer 220 and the metal foam layer 230 has at least one bendable area FA. At least one perforated pattern 234 is formed in at least one bendable area FA of the metal foam layer 230.

In the second embodiment, at least one perforated pattern 234 extends in the thickness direction of the metal foam layer 230.

In the second embodiment, at least one perforated pattern 234 has a width that decreases as it extends from a vertical center toward each of the top and the bottom thereof.

In the third embodiment, the first perforated pattern 236a is formed in the horizontal center of the bendable area FA of the metal foam layer 230, and the second perforated patterns 236b having a thickness smaller than that of the first perforated pattern 236a are formed to be respectively adjacent to both opposing sides of the first perforated pattern.

In the fourth embodiment, at least one perforated pattern 234 extends in the width direction of the metal foam layer.

In the fourth embodiment, at least one perforated pattern 234 has a thickness that decreases as it extends from a horizontal center thereof towards each of both opposing sides thereof in the horizontal direction.

In the fifth embodiment, the third perforated pattern 234a is formed in the bendable area FA of the metal foam layer 230 and extends in the width direction of the metal foam layer 230. The fourth perforated patterns 234b and 234c having a smaller width than that of the third perforated pattern 234a are formed under the third perforated pattern 234a.

The display module DM according to the sixth embodiment includes the display panel 310, the adhesive layer 320 bonded to the lower portion of the display panel 310, and the metal foam layer 330 bonded to the lower portion of the adhesive layer 320 and having a plurality of pores. Each of the display panel 310, the adhesive layer 320 and the metal foam layer 330 has the bendable area FA and the non-bendable areas NFA1 and NFA2. The organic material layer 340 is included in the bendable area FA so that the bendable area FA has a lower modulus than that of each of the non-bendable areas NFA1 and NFA2.

In the sixth embodiment, the metal foam layer 330 includes the first metal foam layer 332 corresponding to the bendable area FA and the second metal foam layer 334a corresponding to the non-bendable area.

In the sixth embodiment, the thickness of the first metal foam layer 332 is smaller than that of the second metal foam layer 334a.

In the sixth embodiment, the organic material layer 340 is received in the space corresponding to the difference between the thicknesses of the first metal foam layer 332 and the second metal foam layer 334a.

In the sixth embodiment, the organic material layer 340 is formed between the adhesive layer 310 and the first metal foam layer 332 corresponding to the bendable area FA.

In the seventh embodiment, the organic material layer 340 is formed under the first metal foam layer 332 corresponding to the bendable area FA.

In the eighth embodiment, at least one perforated pattern 332a is formed in the first metal foam layer 332.

In the eighth embodiment, at least one perforated pattern 332a extends in the thickness direction of the first metal foam layer 330.

In the eighth embodiment, at least one perforated pattern 332a extends in the width direction of the first metal foam layer 330.

The display device 100 according to one embodiment includes the display module DM. The display module DM includes the display panel 210, the adhesive layer 220 bonded to the lower portion of the display panel 210, and the metal foam layer 230 bonded to the lower portion of the adhesive layer 220 and having a plurality of pores therein. Each of the display panel 210, the adhesive layer 220 and the metal foam layer 230 has at least one bendable area FA. At least one perforated pattern 234 is formed in at least one bendable area FA of the metal foam layer 230.

The display device 100 according to another embodiment includes the display module DM, and the display module DM includes the display panel 310, the adhesive layer 320 bonded to the lower portion of the display panel 310, and the metal foam layer 330 bonded to the lower portion of the adhesive layer 320 and having a plurality of pores. Each of the display panel 310, the adhesive layer 320 and the metal foam layer 330 has the bendable area FA and the non-bendable areas NFA1 and NFA2. The organic material layer 340 is included in the bendable area FA so that the bendable area FA has a lower modulus than that of each of the non-bendable areas NFA1 and NFA2.

The scope of protection of the present disclosure should be construed by the scope of the claims, and all technical ideas within the scope equivalent thereto should be construed as being included in the scope of the present disclosure. Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A display module, comprising:
a display panel;
a metal foam layer including a metal material with multiple pores in the metal material; and
an adhesive layer disposed between the display panel and the metal foam layer to adhere the metal foam layer to a back face of the display panel,
wherein each of the display panel, the adhesive layer, and the metal foam layer has at least one bendable area and at least one non-bendable area,
wherein at least one perforated pattern is disposed in the at least one bendable area of the metal foam layer,
wherein the at least one perforated pattern is an empty space devoid of the metal material and is larger in size than the multiple pores of the metal foam layer in the at least one non-bendable area, and
wherein, within the at least one bendable area of the metal foam layer, the at least one perforated pattern includes:
a first perforation pattern having a first width equal to an entire width of the at least one bendable area of the metal foam layer formed under the adhesive layer,
a second perforation pattern having a second width smaller than the first width, the second perforation pattern formed under the first perforation pattern, and
a third perforation pattern having a third width smaller than the second width, the third perforation pattern formed under the second perforation pattern,
wherein the first width, the second width, and the third width decrease with increasing distance from the back face of the display panel.

2. The display module of claim 1, wherein the at least one perforated pattern extends in a thickness direction of the metal foam layer.

3. The display module of claim 2, wherein the at least one perforated pattern has a width decreasing as the at least one perforated pattern extends from a vertical center thereof toward each of a top and a bottom thereof.

4. The display module of claim 2, wherein the at least one perforated pattern has an oval or a rhombus shape.

5. The display module of claim 1, wherein the at least one perforated pattern extends in a width direction of the metal foam layer.

6. The display module of claim 5, wherein the at least one perforated pattern has a thickness decreasing as the at least one perforated pattern extends from a horizontal center thereof toward each of both opposing sides thereof in the width direction.

7. The display module of claim 1, wherein one perforated pattern of the at least one perforated pattern in the at least one bendable area of the metal foam layer extends in a thickness direction of the metal foam layer and another perforated pattern of the at least one perforated pattern in the at least one bendable area of the metal foam layer extends in a width direction of the metal foam layer.

8. The display module of claim 1, wherein the adhesive layer is between the display panel and the metal foam layer to adhere the metal foam layer to the display panel.

* * * * *